US008719679B2

(12) United States Patent
Nakamura et al.

(10) Patent No.: US 8,719,679 B2
(45) Date of Patent: May 6, 2014

(54) TRANSMISSION APPARATUS RECEPTION APPARATUS AND COMMUNICATION SYSTEM

(75) Inventors: Osamu Nakamura, Osaka (JP); Yasuhiro Hamaguchi, Osaka (JP); Kazunari Yokomakura, Osaka (JP); Jungo Goto, Osaka (JP); Hiroki Takahashi, Osaka (JP); Shinsuke Ibi, Suita (JP); Seiichi Sampei, Suita (JP); Shinichi Miyamoto, Suita (JP)

(73) Assignees: Sharp Kabushiki Kaisha, Osaka (JP); Osaka University, Osaka (JP)

( * ) Notice: Subject to any disclaimer, the term of this patent is extended or adjusted under 35 U.S.C. 154(b) by 50 days.

(21) Appl. No.: 13/254,577

(22) PCT Filed: Mar. 3, 2010

(86) PCT No.: PCT/JP2010/053405
§ 371 (c)(1),
(2), (4) Date: Dec. 7, 2011

(87) PCT Pub. No.: WO2010/101173
PCT Pub. Date: Sep. 10, 2010

(65) Prior Publication Data
US 2012/0096336 A1    Apr. 19, 2012

(30) Foreign Application Priority Data

Mar. 3, 2009    (JP) ................. 2009-049936

(51) Int. Cl.
H03M 13/23    (2006.01)
H03M 13/53    (2006.01)
(52) U.S. Cl.
USPC .......................................... 714/790; 714/712
(58) Field of Classification Search
None
See application file for complete search history.

(56) References Cited

U.S. PATENT DOCUMENTS 4,601,044 A * 7/1986 Kromer et al. ................ 375/286
6,675,347 B1   1/2004 Razoumov et al.
(Continued)

FOREIGN PATENT DOCUMENTS

| JP | 2002-305454 A | 10/2002 |
| JP | 2004-505489 A | 2/2004 |
| JP | 2008-160169 A | 7/2008 |
| WO | WO 02/09294 A2 | 1/2002 |

OTHER PUBLICATIONS

Imai et al., "A new Multilevel Coding Method Using Error-Correcting Codes", IEEE Transactions on Information Theory, vol. IT-23, No. 3, 1977, pp. 371-377.

(Continued)

Primary Examiner — Ajay Bhatia
Assistant Examiner — Dipakkumar Gandhi
(74) Attorney, Agent, or Firm — Birch, Stewart, Kolasch & Birch, LLP

(57) ABSTRACT

To improve performance of a decoder even in a system with the coder configuration determined by inserting a doping bit sequence known between a transmission apparatus and a reception apparatus in an information bit sequence to transmit, the transmission apparatus is a transmission apparatus that transmits radio signals to the reception apparatus, and is provided with a doping section 23 that inserts a doping bit sequence which is known between the transmission apparatus and the reception apparatus in an information bit sequence to transmit to the reception apparatus, coding sections 11a, 11b that perform error-correcting coding on a bit sequence with the doping bit sequence inserted therein, a puncturing section that performs puncturing on a bit sequence subjected to the error-correcting coding, and a wireless transmission section 24 that transmits a bit sequence subjected to the puncturing.

4 Claims, 12 Drawing Sheets

(56) References Cited

U.S. PATENT DOCUMENTS

| | | |
|---|---|---|
| 6,912,684 B2 | 6/2005 | Miyata et al. |
| 7,142,672 B2* | 11/2006 | Bianchini et al. ............... 380/33 |
| 2002/0003846 A1* | 1/2002 | Khayrallah et al. .......... 375/341 |
| 2003/0123565 A1* | 7/2003 | Fukuda et al. ................ 375/267 |
| 2007/0044000 A1* | 2/2007 | Shen et al. .................... 714/758 |
| 2008/0141103 A1 | 6/2008 | Miyazaki et al. |
| 2009/0060094 A1* | 3/2009 | Jung et al. .................... 375/340 |

OTHER PUBLICATIONS

Li et al., "Bit-interleaved coded modulation with iterative decoding using soft feedback", Electronics Letters, vol. 34, No. 10, May 14, 1998, pp. 942-943.

International Search Report (Form PCT/ISA/210) for International Application No. PCT/JP2010/053405, dated Jun. 1, 2010.

* cited by examiner

INPUT INFORMATION BIT
/OUTPUT PARITY BIT

SIGNAL CONSTELLATION OF LAYER 2

SIGNAL CONSTELLATION OF LAYER 1

US 8,719,679 B2

TRANSMISSION APPARATUS RECEPTION APPARATUS AND COMMUNICATION SYSTEM

TECHNICAL FIELD

The present invention relates to techniques for inserting a known doping bit sequence in an information bit sequence.

BACKGROUND ART

Since creation of the information theory by Shannon, for the purpose of increasing the speed and capacity of wireless communication systems, many studies have been made on transmission schemes to actualize the Shannon limit that is the upper limit of the transmissible communication rate with respect to a given radio communication channel. As techniques for asymptotically achieving the Shannon limit, there are coding and modulation, and in the coding scheme, turbo codes having the high error-correcting function are used frequently in the current wire less communication systems, and adopted in various standards.

Meanwhile, in the modulation scheme, optimal signal constellations in multilevel modulation have been studied to achieve larger transmission capacity. As the signal constellation, gray coding is the most popular, and as shown in FIG. 10, in symbols adjacent to one another in the perpendicular and horizontal direction, the symbols are placed so that only a single bit differs so as to minimize bit errors occurring in symbol error. Further, there exists a modulation scheme called multilevel coding. For example, when transmission of 4 bits is performed on a single transmission occasion, multilevel coding is a modulation scheme to constitute modulation signals as multilayer QPSK as shown in the figure.

Coding and modulation have been studied independently for a long time, and to aim at further asymptotic Shannon limit, studies have been started on coding and modulation schemes to combine both of the techniques for optimization. For example, Non-patent Document 1 proposes techniques for performing different coding for each layer in multilevel coding. In multilevel coding, as shown in FIG. 11B, the inter-signal-point distance of the layer 2 is different from the inter-signal-point distance of the layer 1. Therefore, when the same error-correcting code is used for each layer, transmission characteristics are different.

In other words, as compared with the layer 2, transmission characteristics of the layer 1 significantly deteriorate. Therefore, as shown in FIG. 12, Non-patent Document 1 proposes the communication system in which, when M layers exist, an information source is coded in coders with different coding rates for each layer, and a D-A converter (modulator) converts bits into symbols to transmit.

For example, when multilevel coding is performed as shown in FIGS. 11A and 11B, since the inter-signal-point distance is long in the layer 2, the coding rate is increased. Meanwhile, since the inter-signal-point distance is short in the layer 1, the coding rate is decreased. It is thereby possible to perform error-correcting coding with appropriate redundancy even in the case of providing amplitude with the information, and it is possible to enhance transmission characteristics of the entire transmission sequence.

Meanwhile, in recent years, studies have been also made on BICM-ID (Bit Interleaved Code Modulation with Iterative Detection) that achieves further improvements of transmission capacity by using iterative signal detection in the coding modulation scheme. For example, Non-patent Document 2 shows that it is possible to improve characteristics by inputting an output of a decoder to a demodulator as feedback to use as a priori information in demodulation.

PRIOR ART DOCUMENT

Non-Patent Document

Non-patent Document 1: H. Imai, S. Hirakawa, "A New Multilevel Coding Method Using Error-Correcting Codes," IEEE, May 1977, Trans. Inform. Theory, vol. IT-23, No. 3.

Non-patent Document 2: X. Li, J. A. Ritcey, "Bit-interleaved coded modulation with iterative decoding using soft feedback," IEEE, May 1998, Commun. Lett., vol. 34, No. 10, pp. 942-943.

DISCLOSURE OF INVENTION

Problems to be Solved by the Invention

The present invention was made in view of such circumstances, and it is an object of the invention to provide a transmission apparatus, reception apparatus and communication system for enabling high coding modulation gain to be obtained without reducing the entire redundancy using current coder configurations.

Means for Solving the Problem (1) To obtain the above-mentioned object, the invention took measures as described below. In other words, a transmission apparatus of the invention is a transmission apparatus that transmits radio signals to a reception apparatus, and is characterized by having a doping section that inserts a doping bit sequence which is known between the transmission apparatus and the reception apparatus in an information bit sequence to transmit to the reception apparatus, a coding section that performs error-correcting coding on a bit sequence with the doping bit sequence inserted therein, a puncturing section that performs puncturing on a bit sequence subjected to the error-correcting coding, and a wireless transmission section that transmits a bit sequence subjected to the puncturing.

Thus, since a doping bit sequence known between the transmission apparatus and the reception apparatus is inserted in an information bit sequence to transmit to the reception apparatus, it is possible to adjust propagation characteristics of the layer, and it is possible to enhance the error-correcting capability without changing the configuration of the error-correcting coding section.

(2) Further, the transmission apparatus of the invention is characterized by further having a sequence dividing section that divides an information bit sequence to transmit to the reception apparatus into a plurality of bit sequences, where the doping section inserts the doping bit sequence in at least one bit sequence among the divided bit sequences, and the coding section performs error-correcting coding on the bit sequence with the doping bit sequence inserted therein or a bit sequence without the doping bit sequence being inserted therein.

Thus, among the divided bit sequences, the doping bit sequence is inserted in at least one bit sequence, error-correcting coding is performed on the bit sequence with the doping bit sequence inserted therein or bit sequence without the doping bit sequence being inserted therein, it is thereby possible to adjust propagation characteristics of each layer, and as a result, it is possible to enhance the entire propagation characteristics. Further, by inserting a doping bit sequence, it is possible to enhance the error-correcting capability without changing the configuration of the error-correcting coding section.

(3) Furthermore, in the transmission apparatus of the invention, it is a feature that the sequence dividing section divides an information bit sequence to transmit to the reception apparatus into bit sequences corresponding to the number of layers, the doping section inserts the doping bit sequence in a bit sequence corresponding to at least one layer among the divided bit sequences, and that the puncturing section performs puncturing on the bit sequence with the doping bit sequence inserted therein and the bit sequence without the doping bit sequence being inserted therein using respective different puncturing rates.

Thus, among the divided bit sequences, the doping bit sequence is inserted in a bit sequence corresponding to at least one layer, puncturing is performed on the bit sequence with the doping bit sequence inserted therein and the bit sequence without the doping bit sequence being inserted therein using respective different puncturing rates, and therefore, by using that propagation characteristics of each layer are different, it is possible to adjust propagation characteristics of each layer by varying the rate of puncturing for each layer, and inserting the doping bit sequence. As a result, it is possible to enhance the entire propagation characteristics, and it is possible to enhance the error-correcting capability without changing the configuration of the error-correcting coding section.

(4) Further, a reception apparatus of the invention is a reception apparatus that receives radio signals transmitted from a transmission apparatus, and is characterized by having a wireless reception section that extracts a bit sequence from a received radio signal, and a decoding section that performs error-correcting decoding on the received bit sequence based on information indicative of a doping bit sequence inserted in the bit sequence and an insertion position of the doping bit sequence.

Thus, since error-correcting decoding is performed on the received bit sequence based on the information indicative of a doping bit sequence inserted in the bit sequence and an insertion position of the doping bit sequence, it is possible to decrease the number of state transitions, and to enhance the error-correcting capability.

(5) Furthermore, the reception apparatus of the invention is characterized by further having a sequence combining section that combines a plurality of divided bit sequences, where the decoding section performs error-correcting decoding on each of the bit sequence with the doping bit sequence inserted therein and a bit sequence without the doping bit sequence being inserted therein, and the sequence combining section combines bit sequences subjected to the error-correcting decoding, and outputs an information bit sequence.

Thus, since error-correcting decoding is performed on the received bit sequence based on the information indicative of a doping bit sequence inserted in the bit sequence and an insertion position of the doping bit sequence, it is possible to decrease the number of state transitions, and to enhance the error-correcting capability.

(6) Still furthermore, the reception apparatus of the invention is characterized by further having a MAP demodulation section that performs demodulation using the bit sequence input from the wireless reception section and the bit sequences subjected to the error-correcting decoding, and iterating decoding in the error-correcting decoding section and demodulation in the MAP demodulation section an arbitrary number of times.

Thus, since decoding in the error-correcting decoding and demodulation in the MAP demodulation section is iterated an arbitrary number of times, it is made possible to calculate likelihood of a target bit using likelihood of another bit constituting part of the symbol. As a result, it is possible to improve propagation characteristics. Further, with such iterative processing in the reception apparatus assumed to be the premise, even when the transmission apparatus decreases the number of bits of the doping bit sequence, and/or increases the puncturing rate, it is possible to maintain predetermined communication quality. By this means, it is possible to perform transmission more excellent in spectral efficiency.

(7) Further, a communication system of the invention is characterized of being comprised of the transmission apparatus as described in above-mentioned (1), and the reception apparatus as described in above-mentioned (4), or the transmission apparatus as described in above-mentioned (2), and the reception apparatus as described in above-mentioned (5).

According to this configuration, since the doping bit sequence known between the transmission apparatus and the reception apparatus is inserted in an information bit to transmit to the reception apparatus, it is possible to adjust propagation characteristics of the layer, and to enhance the error-correcting capability without changing the configuration of the error-correcting coding section.

Advantageous Effect of the Invention

According to the invention, since a doping bit sequence known between the transmission apparatus and the reception apparatus is inserted in an information bit sequence to transmit to the reception apparatus, it is possible to adjust propagation characteristics of the layer, and it is possible to enhance the error-correcting capability without changing the configuration of the error-correcting coding section.

BRIEF DESCRIPTION OF DRAWINGS

FIG. 3 is a block diagram illustrating a schematic configuration of an RSC section 14a;

BEST MODE FOR CARRYING OUT THE INVENTION

In the following description, this Embodiment describes a method for obtaining high gain of modulation coding and BICM-ID by exchanging redundancy between layers, using multilevel coding (multilayer modulation) as an example, with reference to drawings.

Embodiment 1

Figure 1:
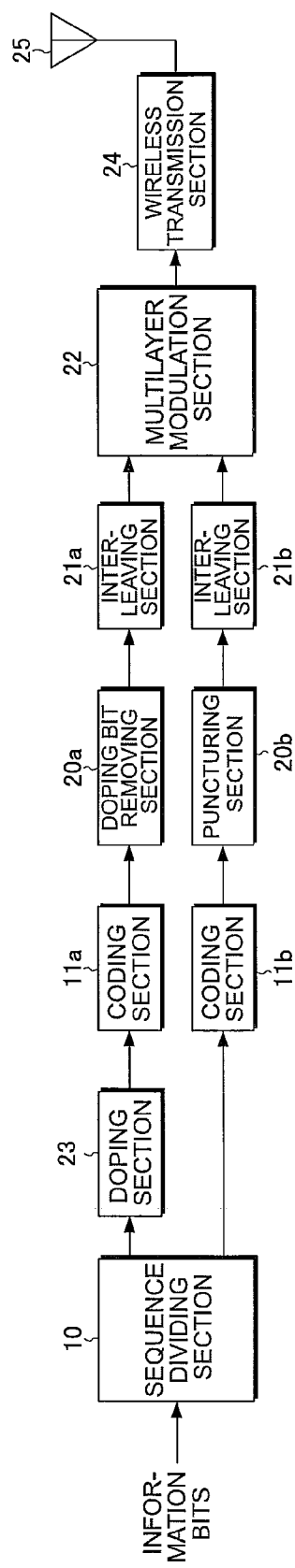
FIG. 1 is a block diagram illustrating a schematic configuration of a transmission apparatus according to Embodiment 1 of the invention.

FIG. 1 is a block diagram showing an example of a schematic configuration of a transmission apparatus according to Embodiment 1 of the invention. Herein, this Embodiment is predicated on narrowband single-carrier transmission to simplify the description, but the invention is applicable to OFDM (Orthogonal Frequency Division Multiplexing) that is multi carrier transmission, and DFT-S-OFDM (Discrete Fourier Transform Spread OFDM), etc. that are wideband single-carrier transmission. Further, the description is given by assuming that both the number of transmission antennas and the number of reception antennas are "1", but the invention is applicable to multi-antenna systems.

In FIG. 1, a sequence dividing section 10 divides an information bit sequence of N bits to transmit into sequences corresponding to the number of layers. In addition, in this Embodiment, for the sake of simplicity, the description is given by assuming that the number of layers is "2", but also in the case that the number of layers is "3" or more, the invention is capable of being carried into practice. Herein, the description is given by assuming that the sequence dividing section 10 divides N bits into $N_1$ bits and $N_2$ bits.

Figure 6:
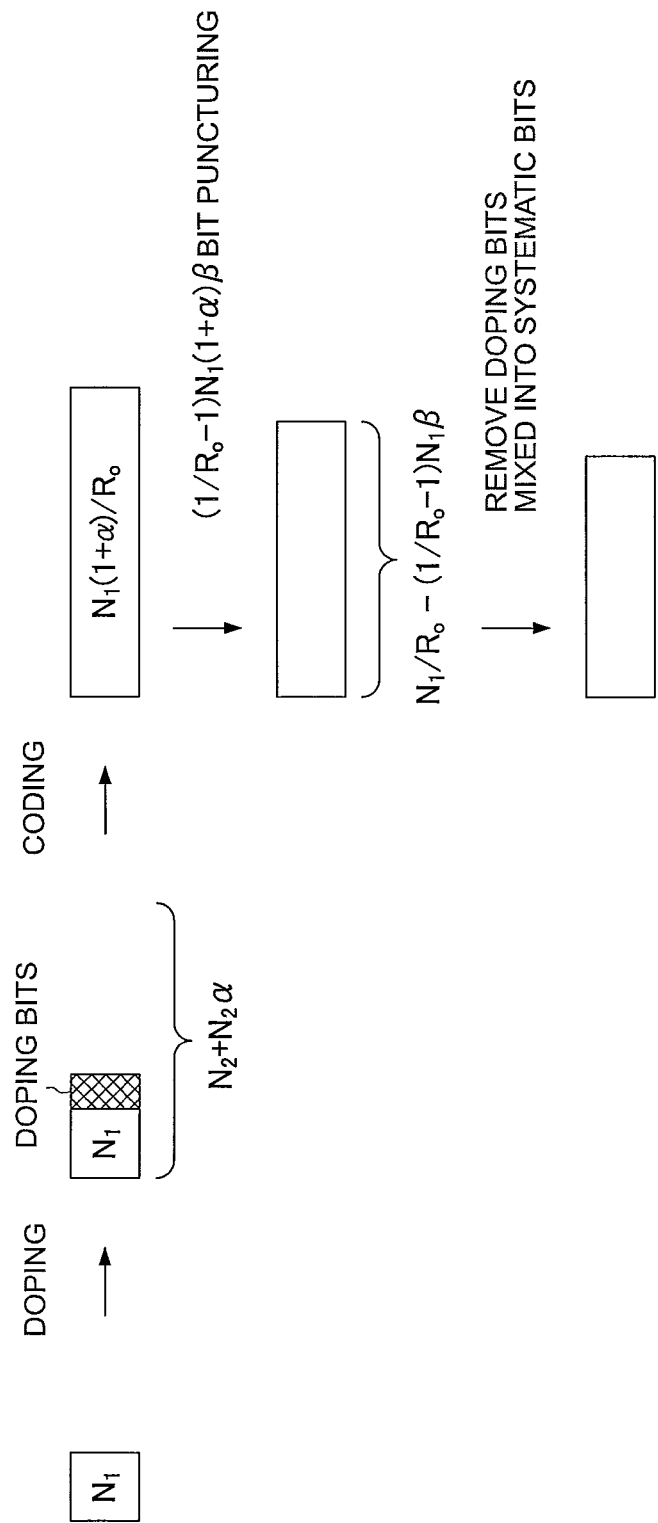
FIG. 6 is a diagram illustrating the concept of inserting (doping) a known bit sequence in a known place.

The $N_1$-bit sequence output from the sequence dividing section 10 is input to a doping section 23. As shown in FIG. 6, the doping section 23 inserts (dopes) a bit sequence known between the transmission apparatus and the reception apparatus in a known place. At this point, the doping bit sequence to dope is any of M sequences, Gold sequences and the like, as long as the sequence is known between the transmission apparatus and the reception apparatus. Further, the places to insert may be discrete or consecutive. The number of bits of the sequence, which is obtained by performing the doping processing on the information bit sequence of $N_1$ bits with a doping rate $\alpha$, is $(1+\alpha) N_1$ bits. The output of the doping section 23 is input to a coding section 11a in FIG. 1, and undergoes error-correcting coding.

The coding section 11a performs error-correcting coding of turbo codes, convolutional codes, and the like. This Embodiment describes the case that turbo codes are used as error-correcting code, but the invention is applicable to the case that other error-correcting codes (for example, convolutional codes) are assumed.

Figure 2:
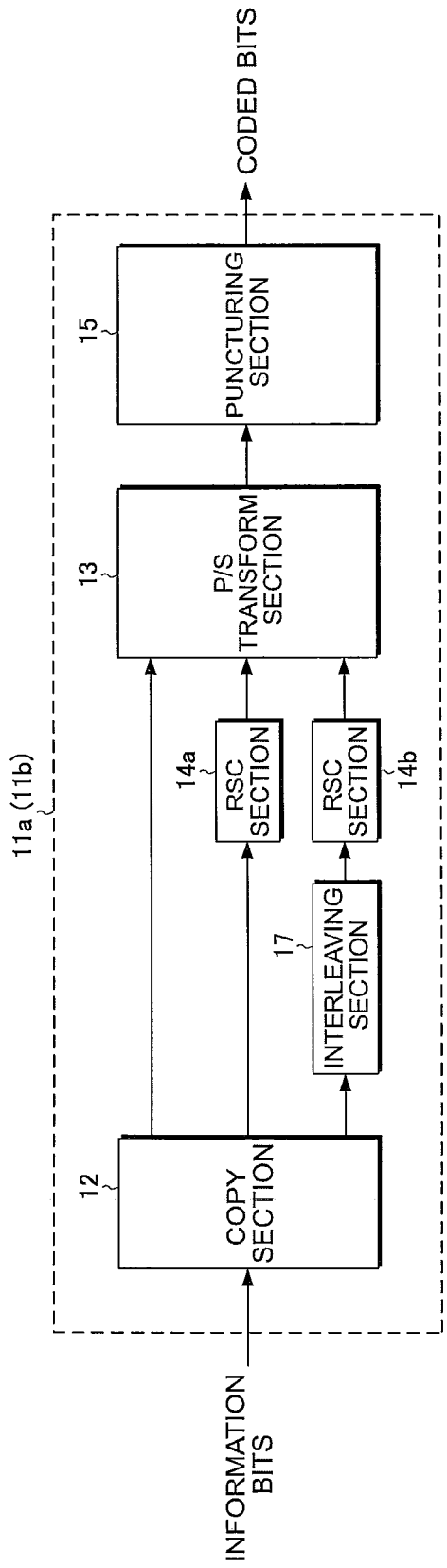
FIG. 2 is a block diagram illustrating a schematic configuration of a coding section 11a (11b)

FIG. 2 is a block diagram illustrating a schematic configuration of the coding section 11a (11b). In FIG. 2, the input information bit sequence is input to a copy section 12, and the information bit sequence of $N_1$ bits is copied. The first output of the copy section 12 is input to a P/S transform section 13 without any processing as systematic bits. The second output of the copy section 12 is input to an RSC section 14a.

Figure 3:
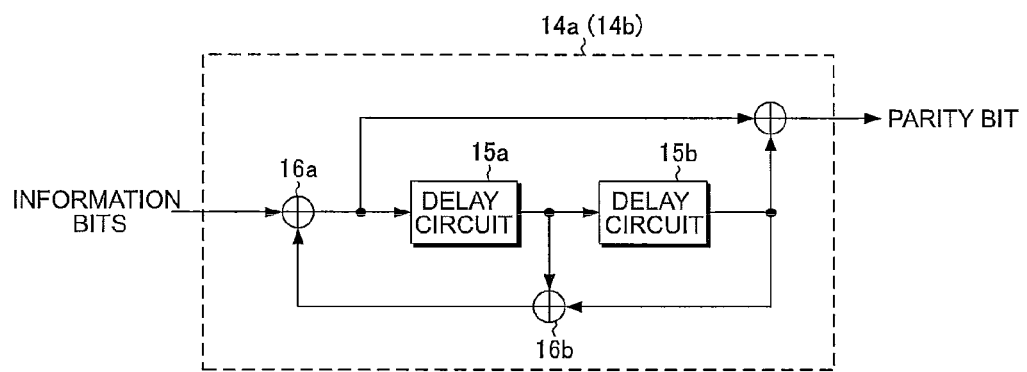

FIG. 3 is a block diagram illustrating a schematic configuration of the RSC section 14a. The RSC section 14a performs coding with recursive systematic convolutional code. As shown in FIG. 3, the RSC section 14a adopts a configuration in which a parity (redundant) bit of 1 bit is output per input information bit of 1 bit by delay circuits 15a, 15b and exclusive OR sections 16a to 16c. In addition, the RSC section 14b adopts the same configuration.

Figure 4:
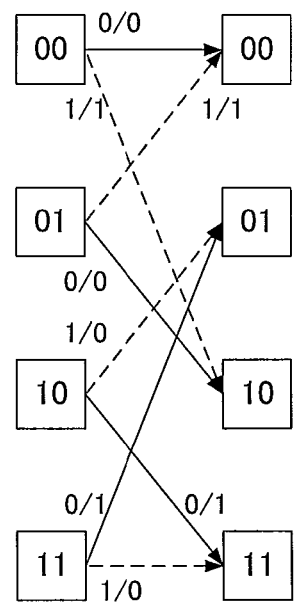
FIG. 4 is a state transition diagram.
Figure 5:
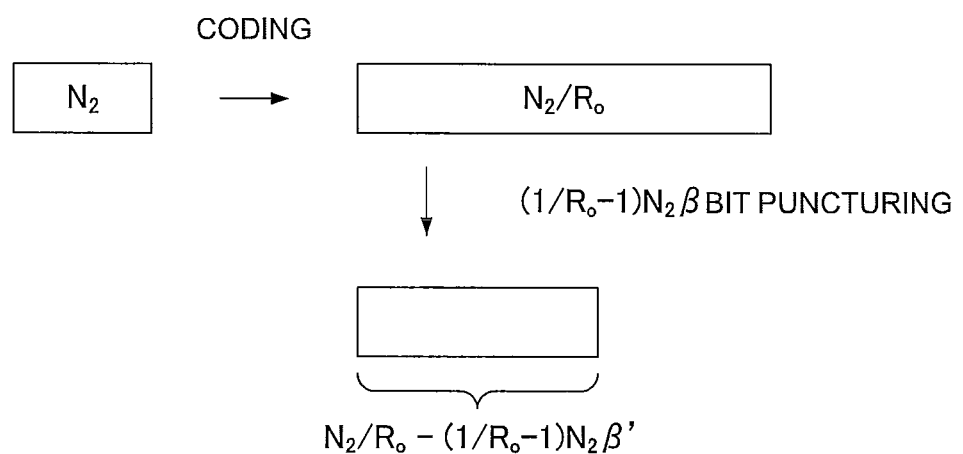
FIG. 5 is a diagram illustrating the concept of coding and puncturing.

FIG. 4 is a state transition diagram of the RSC section 14a (RSC section 14b). In FIG. 4, numbers within a box represent the state of a shift register (delay circuit 15a, 15b). Numbers described in the arrow and near the arrow respectively represent transition of the state of the shift register and (input information bit/output redundant output bit) in the transition. For example, transition of from the state "10" to state of "01" represents that the input information bit is "1", and that an information bit to output at this point is "0". Thus, coding is performed with constraints added to the information bit to input, the state of the shift register and output redundant bit.

In FIG. 2, the third output of the copy section is input to an interleaving section 17. The interleaving section 17 interchanges the sequence order of the information bits to output to the RSC section 14b. The P/S transform section 13 performs P/S (Parallel-to-Serial) transform on the systematic bits and two redundant bits, and outputs a coded bit sequence. In this Embodiment, the description is given by assuming that the coding rate is ⅓, and when the coding rate of the error-correcting code is $R_o$, the number of coded bits output from the P/S transform section 13 is expressed by Equation (1).

[Eq. 1]
$$\frac{N_1(1+\alpha)}{R_o} \tag{1}$$

The coded bit sequence represented by Eq. (1) is input to a puncturing section 15 inside the coding section. A puncturing section 20b performs puncturing with a puncturing rate $\beta$. Puncturing of the number of bits expressed by Equation (2) is performed.

[Eq. 2]
$$\left(\frac{1}{R_o} - 1\right) N_1 (1+\alpha) \beta \tag{2}$$

Accordingly, the puncturing section 15 outputs the number of bits expressed by Equation (3).

[Eq. 3]
$$\frac{N_1(1+\alpha)}{R_o} - \left(\frac{1}{R_o} - 1\right) N_1 (1+\alpha) \beta \tag{3}$$

The output of the coding section is input to a doping bit removing section. As shown in FIG. 2, in the turbo code, systematic (information) bits without undergoing constrains by other bits are transmitted, but doping bits included in the systematic bits are a known sequence between transmission and reception, and are not needed to be transmitted. Therefore, the doping bit removing section removes $N_1 \alpha$ doping bits inserted in the information bits. In other words, the doping bit removing section 20a outputs a sequence of the number of bits expressed by Equation (4) to an interleaving section 21a.

[Eq. 4]
$$\frac{N_1(1+\alpha)}{R_o} - \left(\frac{1}{R_o} - 1\right) N_1 (1+\alpha) \beta - N_1 \alpha \tag{4}$$

Herein, the coding rate $R_1$ of the layer 1 is expressed by Equation (5).

[Eq. 5]

$$R_1 = \frac{N_1}{\frac{N_1(1+\alpha)}{R_o} - \left(\frac{1}{R_o} - 1\right)N_1(1+\alpha)\beta - N_1\alpha} \quad (5)$$

$$= \frac{R_o}{(1+\alpha) - (1-R_o)(1+\alpha)\beta - R_o\alpha}$$

Meanwhile, the information bit sequence of $N_2$ bits output from the sequence dividing section 10 in FIG. 1 is input to the coding section 11b. The coding section 11b is predicated on using the same as in the coding section 11a used in the layer 1. Accordingly, the number of bits output from a P/S transform section 13 inside the coding section 11b is $N_2/R_o$. The output of the coding section 11b is input to a puncturing section 20b. Puncturing is performed using the same puncturing rate as the puncturing rate in the coding section 11a. The output of the puncturing section 15 shown in FIG. 2 is input to the puncturing section 20b as an output of the coding section 11b. The puncturing section 20b performs puncturing so that β' is the total puncturing rate with the puncturing rate of the puncture section 15 in the coding section 11b. Accordingly, the number of bits removed in output from the puncture section 20b is expressed by Equation (6).

[Eq. 6]

$$\left(\frac{1}{R_o} - 1\right)N_2\beta' \quad (6)$$

Accordingly, the coding rate $R_2$ of the layer 2 is as follows:

[Eq. 7]

$$R_2 = \frac{N_2}{\frac{N_2}{R_o} - \left(\frac{1}{R_o} - 1\right)N_2\beta'} \quad (7)$$

$$= \frac{R_o}{1 - \beta'(1-R_o)}$$

Accordingly, the coding rate $R_{sys}$ of the entire system is expressed by Equation (8).

[Eq. 8]

$$R_{sys} = \frac{R_1 + R_2}{2} \quad (8)$$

The bit sequences output from the doping bit removing section 20a and puncturing section 20b are input to a multilayer modulation section 22 via interleaving sections 21a, 21b, respectively. The multilayer modulation section 22 applies multilayer modulation (multilevel coding) using the input bit sequences of the layer 1 and layer 2. For example, the section 22 forms a QPSK signal constellation with amplitude gain of "1" on the coded bit sequence output from the interleaving section 21a. Meanwhile, the section 22 forms a QPSK signal constellation with amplitude gain of "0.5" on the coded bit sequence output from the interleaving section 21b, and generates a symbol sequence by combining two QPSK signal points. The symbol sequence output from the multilayer modulation section 22 is input to a wireless transmission section 24, and after applying D/A (Digital-to-Analog) conversion, filtering, up-conversion, etc., the resultant is transmitted from an antenna section 25.

Thus, by changing redundancy flexibly corresponding to the distance between signal points of each layer in multilevel coding, it is possible to obtain high gain of coding modulation.

Figure 7:
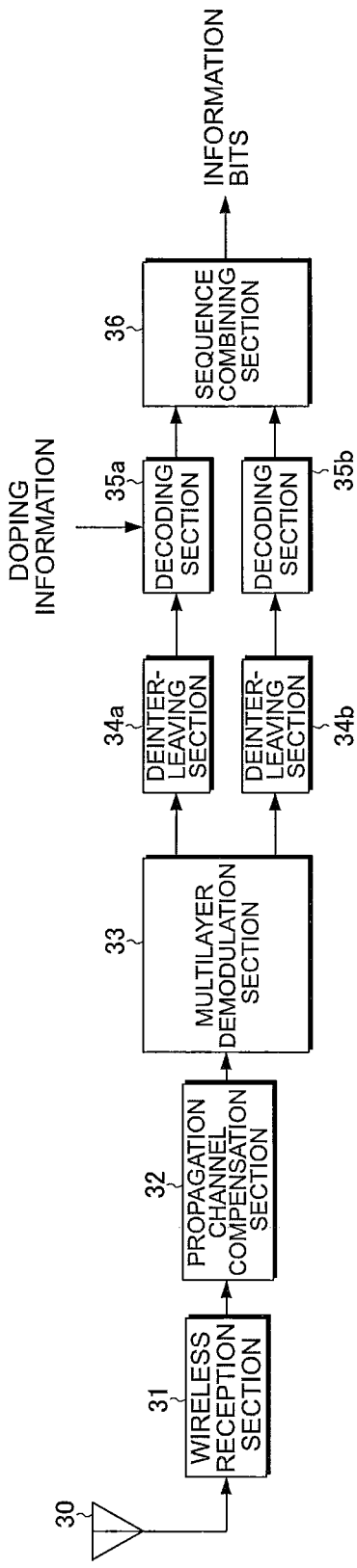
FIG. 7 is a block diagram illustrating a schematic configuration of a reception apparatus according to this Embodiment.

FIG. 7 is a block diagram illustrating a schematic configuration of a reception apparatus according to this Embodiment. A signal received in an antenna section 30 is input to a wireless reception section 31, and the section 30 applies the processing of down-conversion, filtering, A/D (Analog-to-Digital) conversion, etc. The output of the wireless reception section 31 is input to a propagation channel compensation section 32, and the effect exerted in the propagation channel is compensated. The output of the propagation channel estimation section 32 is input to a multilayer demodulation section 33. The multilayer demodulation section 33 calculates a bit Log Likelihood Ratio (LLR) based on the signal constellation of multilayer modulation (multilevel coding).

The bit LLR is input to the deinterleaving sections 34a, 34b for each layer, and the sections performs processing for restoring the order interchanged in the transmission apparatus. The output of the deinterleaving section 34b is input to a decoding section 35b. The decoding 35b performs decoding using a state transition diagram (for example, see FIG. 4) configured based on the coder. The decoding section 35b calculates a probability of each state transition (calculates from the bit LLR), and with respect to redundant bits subjected to puncturing in the transmission apparatus, calculates the bit LLR as "0". The decoding section inputs a decoded hard-decision bit sequence of $N_2$ bits to a sequence combining section.

Figure 8:
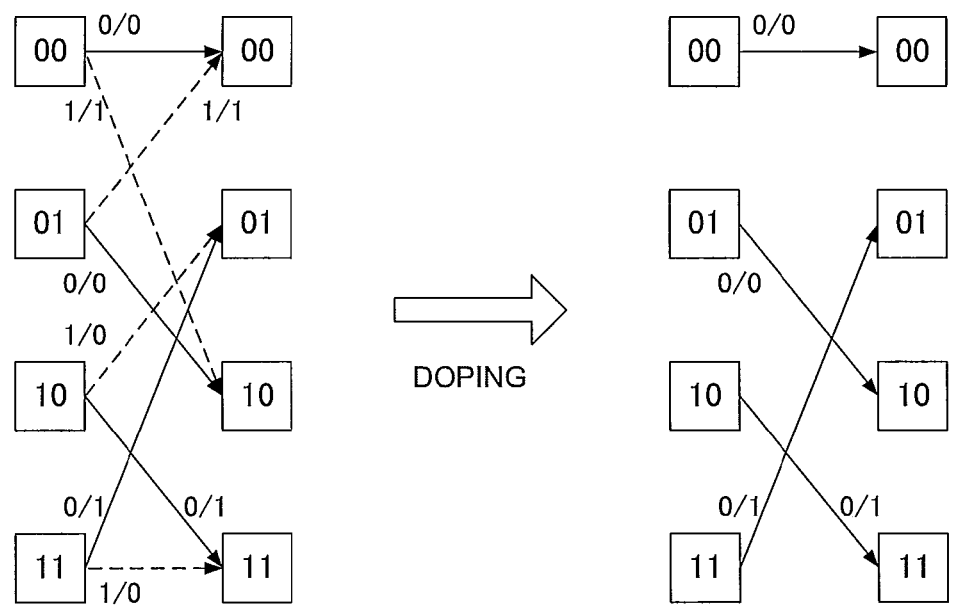
FIG. 8 is a state transition diagram.

Meanwhile, with respect to the bit LLR of the layer 1 output from the multilayer demodulation section 33, the sequence order is restored in the deinterleaving section 34a, and the resultant is input to a decoding section 35a. As in the decoding section 35b, with respect to redundant bits subjected to puncturing in the transmission apparatus, the decoding section 35a calculates the bit LLR as "0". Further, the doping information (sequence of doping bits, inserted positions) is input to the decoding section 35a. The decoding section 35a knows that a systematic (doping) bit is not transmitted in some state transition using the doping information. Accordingly, as shown in FIG. 8, for example, since state transitions by input "1" are eliminated when the transmission apparatus inputs a doping bit of "0", the state transition diagram as shown on the right side in FIG. 8 is configured when the doping bit is inserted.

Thus, by the transmission apparatus performing doping, since the number of state transitions is reduced in half, in the decoding sections 35a, 35b of the reception apparatus, it is possible to enhance the error-correcting capability in the decoding sections 35a, 35b.

In FIG. 7, the outputs of the decoding sections 35a, 35b are input to a sequence combining section 36. The sequence combining section 36 performs the processing for restoring the sequences divided on the transmission apparatus side to the original sequence. The sequence combining section 36 outputs the information bit sequence.

Thus, by using that propagation characteristics of each layer are different in multilevel coding (multilayer modulation), it is possible to adjust propagation characteristics of each layer by increasing the rate of puncturing for each layer, and doping the doping bit, and it is possible to enhance the entire propagation characteristics. Further, by doping the doping bit, it is possible to enhance the error-correcting capability without changing the configuration of the coding section.

Embodiment 2

In Embodiment 1, hard-decision outputs of the decoding sections 35a, 35b are output as information bits without any processing. Meanwhile, when the outputs of the decoding sections 35a, 35b are returned to the multilayer MAP demodulation section and the multilayer MAP demodulation section performs MAP (Maximum A Priori) estimation, it is possible to improve characteristics. A transmission apparatus configuration is the same as in Embodiment 1, and a reception apparatus configuration will be described with reference to drawings.

Figure 9:
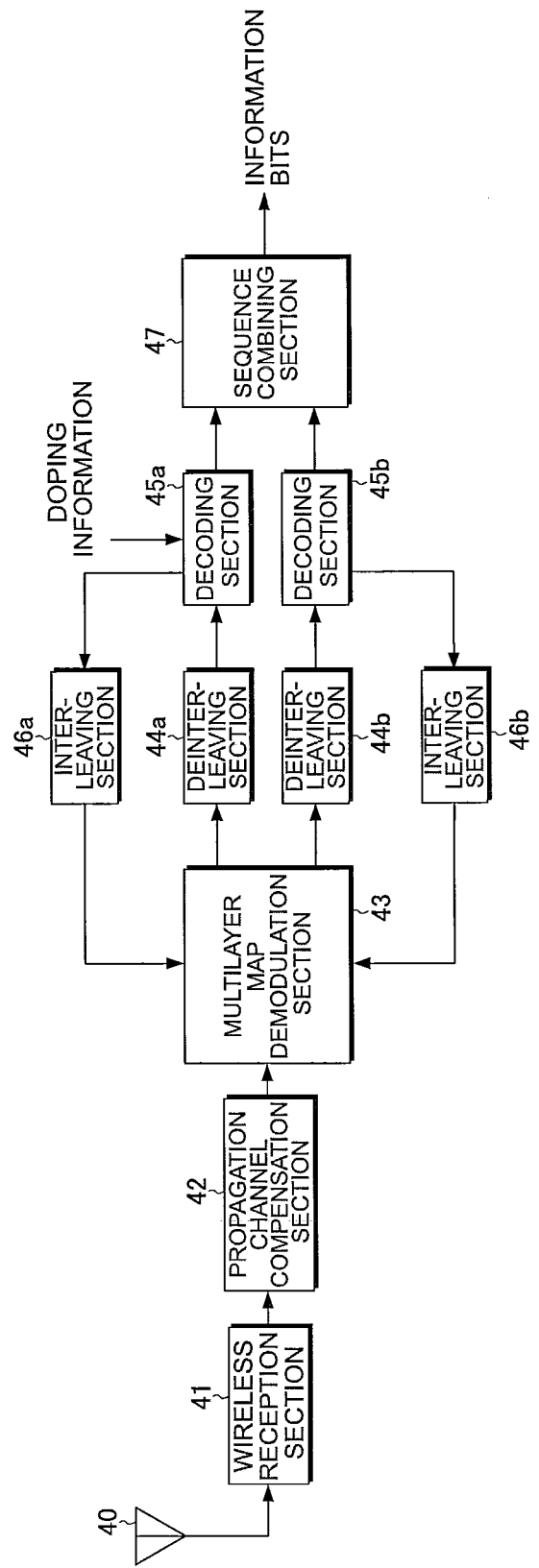
FIG. 9 is a block diagram illustrating a schematic configuration of a reception apparatus according to Embodiment 2.
Figure 10:
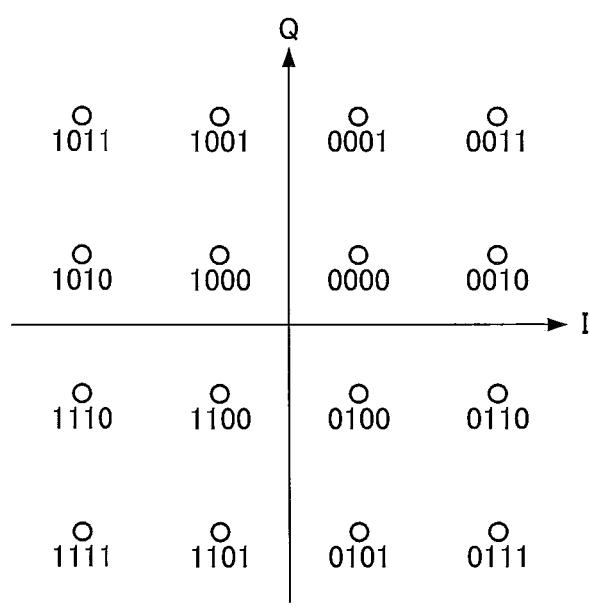
FIG. 10 is a diagram showing a signal constellation.
Figure 11A:
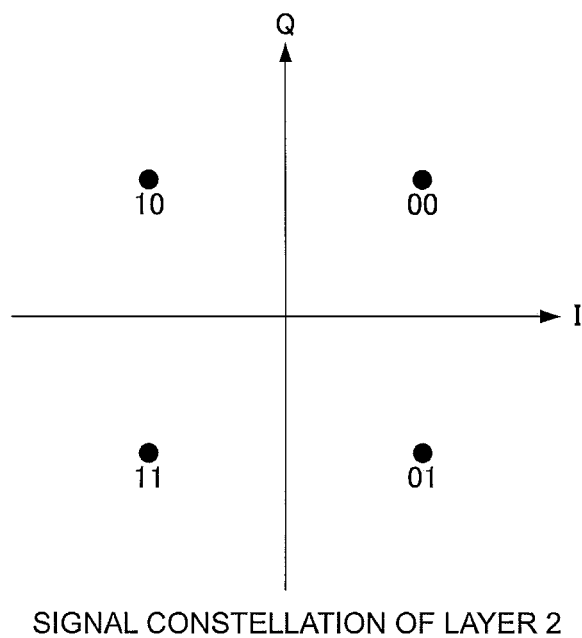
FIG. 11A is a diagram showing an example of performing multilevel coding on 4 bits.
Figure 11B:
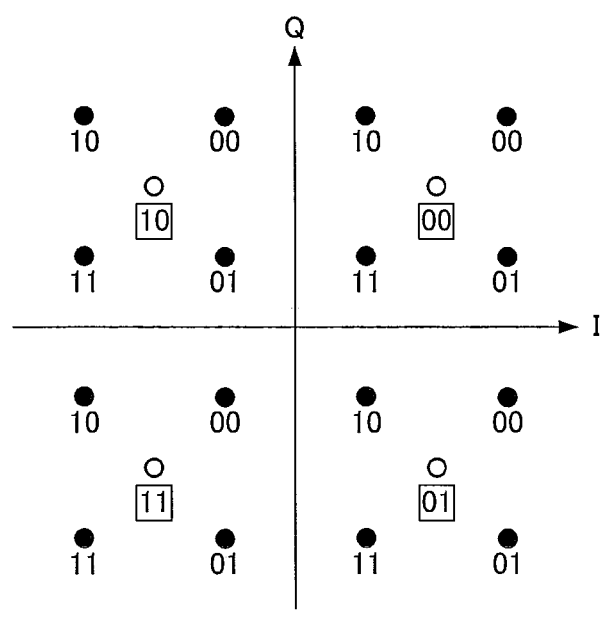
FIG. 11B is a diagram showing another example of performing multilevel coding on 4 bits.
Figure 12:
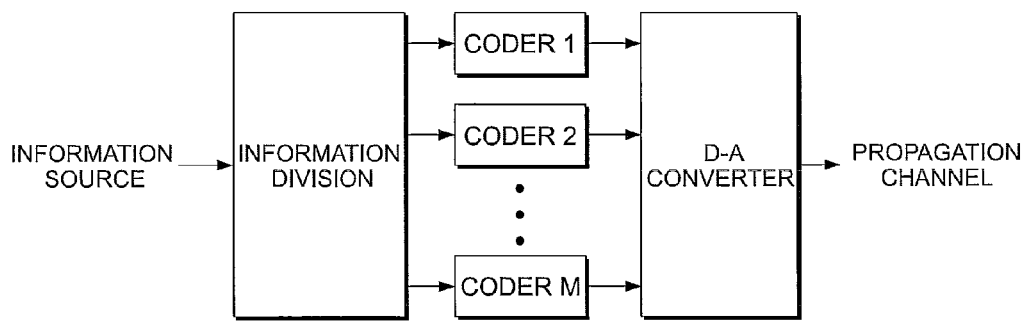
FIG. 12 is a diagram illustrating the outline of a conventional transmission apparatus.

FIG. 9 is a block diagram illustrating a schematic configuration of a reception apparatus according to Embodiment 2. In FIG. 9, a signal received in an antenna 40 is input to a propagation channel estimation section 42 via a wireless reception section 41. The propagation channel estimation section 42 performs processing for compensating for the effect exerted on the signal in the propagation channel. The output of the propagation channel compensation section 42 is input to a multilayer MAP demodulation section 43. The signal processing in the multilayer MAP demodulation section 43 will be described. The multilayer MAP demodulation section 43 calculates the bit LLR for each layer, and outputs the bit LLR of the layer 1 to a deinterleaving section 44a, while outputting the bit LLR of the layer 2 to a deinterleaving section 44b.

The output of the deinterleaving section 44a is input to a decoding section 45a. As in Embodiment 1, the decoding section 45a performs error-correcting decoding while considering that the doping bits are inserted. Then, the decoding section 45a outputs the coded bit LLR subjected to error correction to an interleaving section 46a. In addition, it is also possible to adopt a configuration in which the LLR (a priori LLR) input to the decoding section 45a is subtracted from the LLR (a posteriori LLR) output from the decoding section 45a so that the output of the decoding section 45a is an external LLR, and the resultant is input to the interleaving section 46a.

The interleaving section 46a interchanges the sequence order of the bit LLR in the same order as in the interleaving section 21a of the transmission apparatus as shown in FIG. 1 to output to the multilayer MAP demodulation section 43. Further, with respect to the layer 2, the same processing is performed. In other words, the bit LLR sequence output from the multilayer MAP demodulation section 43 is input to a decoding section 45b via a deinterleaving section 44b. As in Embodiment 1, the decoding section 45b performs error-correcting decoding using the doping information, and outputs the obtained bit LLR to the multilayer MAP demodulation section 43 via the an interleaving section 46b.

The multilayer MAP demodulation section 43 will be described below. Assuming that a reception signal at time t is r(t), r(t) is expressed by Equation (9).

[Eq. 9]

$$r(t) = h(t)s(t) + n(t) \quad (9)$$

Herein, h(t), s(t) and n(t) are respectively a propagation channel, transmission symbol and noise at time t. Further, s(t) is assumed to be comprised of coded bits of J bits $\{b_1(t), b_2(t), \ldots, b_J(t)\}$. The LLR (external LLR) $\lambda^E(b_j(t))$ output from the multilayer MAP demodulation section 43 is given by Equation (10).

[Eq. 10]

$$\lambda^E(b_j) = \ln \frac{Pr[r(t) \mid b_j(t) = +1]}{Pr[r(t) \mid b_j(t) = -1]} \quad (10)$$

$$= \lambda^P(b_j(t)) - \lambda^A(b_j(t))$$

Herein, $\lambda^A(b_j(t))$ is the a priori LLR, and input from the interleaving sections 46a and interleaving section 46b. Meanwhile, $\lambda^P(b_j(t))$ is the a posteriori LLR, and is given by Equation (11).

[Eq. 11]

$$\lambda^P(b_j) = \ln \frac{Pr[b_j(t) = +1 \mid r(t)]}{Pr[b_j(t) = -1 \mid r(t)]} \quad (11)$$

Further, considering that the bit probability is the sum of symbol probabilities including the bit as a component bit, the a posteriori LLR $\lambda^P(b_j(t))$ is expressed by Equation (12).

[Eq. 12]

$$\lambda^P(b_j(t)) = \ln \frac{\sum_{s_i \in \{s \mid b_j = 1\}} Pr[s_i(t) \mid r(t)]}{\sum_{s_i \in \{s \mid b_j = 0\}} Pr[s_i(t) \mid r(t)]} \quad (12)$$

Furthermore, by applying Bayes' theorem to the above-mentioned equation, Equation (13) is obtained.

[Eq. 13]

$$\lambda^P(b_j(t)) = \ln \frac{\sum_{s_i \in \{s \mid b_j = 1\}} Pr[r(t) \mid s_i(t)] Pr[s_i(t)]}{\sum_{s_i \in \{s \mid b_j = 0\}} Pr[r(t) \mid s_i(t)] Pr[s_i(t)]} \quad (13)$$

Herein, $Pr[r(t) \mid s_i(t)]$ is a probability that the reception signal is r(t) on the condition that the transmission symbol is $s_i(t)$, and is expressed by Equation (14) on the assumption that noise has Gaussian distribution.

[Eq. 14]

$$Pr[r(t) \mid s_i(t)] = \frac{1}{2\pi\sigma^2} \exp\left(-\frac{|r(t) - h(t)s_i(t)|^2}{2\sigma^2}\right) \quad (14)$$

Herein, $\sigma^2$ represents dispersion of noise. Further, the case of considering only the maximum value instead of calculating $\Sigma$ of Eq.(13) is also included in the invention. Furthermore, $Pr[s_i(t)]$ in Eq.(13) is a probability of occurrence of a symbol of $s_i(t)$, and is expressed by Equation (15), using the LLR output from the interleaving section.

[Eq. 15]

$$Pr[S_i(t)] = \prod_{j=1}^{J} Pr[b_j(t) = B_{i,j}] \quad (15)$$

In addition, $B_{i,j}\{0,1\}$ is a jth bit among J bits constituting transmission symbol candidates $s_i(t)$. Further, $Pr[b_j(t)=B_{i,j}]$ is expressed by Equation (16).

[Eq. 16]

$$Pr[b_i(t) = B_{i,j}] = \frac{1}{2}\left[1 + (2B_{i,j} - 1)\tanh\left(\frac{\lambda^A[b_j(t)]}{2}\right)\right] \quad (16)$$

The multiplayer MAP demodulation section 43 calculates the LLR $\lambda^E(b_j(t))$ of each bit based on the above-mentioned equations to output to the deinterleaving sections 44a, 44b for each layer. In addition, the above-mentioned description shows an example of demodulation by MAP, but it is not always necessary to adopt the above-mentioned method, and any methods may be used, as long as the methods are to calculate the probability of occurrence of a symbol using outputs of the interleaving sections 46a, 46b.

Further, herein, since a priori information does not exist at the initial process, the multilayer MAP demodulation section 43 calculates the external LLR by assuming that LLR $\lambda^A(b_j(t))$ is "0". After iterating demodulation and decoding a predetermined number of times, the hard-decision value (0 or 1) of the a posteriori LLR calculated in the decoding sections 45a, 45b is input to the sequence combining section 47, and the bit sequence of each layer is thereby combined, and output as information bits.

As described above, by performing the iterative processing in the reception apparatus with consideration given to a symbol, it is possible to calculate the likelihood of a target bit using likelihood of another bit constituting part of the symbol in multilevel modulation. As a result, it is possible to enhance transmission characteristics. Further, with such iterative processing in the reception apparatus assumed to be the premise, even when the transmission apparatus decreases the number of bits of the doping bit sequence, and/or increases the puncturing rate, it is possible to maintain predetermined communication quality, and therefore, it is possible to perform transmission more excellent in spectral efficiency.

DESCRIPTION OF SYMBOLS

10 Sequence dividing section
11a Coding section
11b Coding section
20a Doping bit removing section
20b Puncturing section
21a Interleaving section
21b Interleaving section
22 Multilayer modulation section
23 Doping section
24 Wireless transmission section
25 Antenna section
30 Antenna section
31 Wireless reception section
32 Propagation channel compensation section
33 Multilayer demodulation section
34a Deinterleaving section
34b Deinterleaving section
35a Decoding section
35b Decoding section
36 Sequence combining section
40 Antenna section
41 Wireless reception section
42 Propagation channel compensation section
43 Multilayer MAP demodulation section
44a Deinterleaving section
44b Deinterleaving section
45a Decoding section
45b Decoding section
46a Interleaving section
46b Interleaving section
47 Sequence combining section

The invention claimed is:

1. A transmission apparatus comprising:
a sequence dividing section that divides a transmission bit sequence and generates a plurality of divided bit sequences;
a coding section that performs error-correcting coding independently on each of said plurality of divided bit sequences output by the sequence dividing section so as to generate a plurality of coded bit sequences;
a multilayer modulation section that forms a symbol by bits selected from said plurality of coded bit sequences; and
a doping section that inserts a doping bit sequence, which is already known by a reception apparatus, into at least one of said plurality of divided bit sequences so as to input the generated bit sequence into said coding section corresponding to the distance between signal points of each layer in multilayer modulation.

2. The transmission apparatus according to claim 1, wherein said plurality of divided bit sequences includes at least one bit sequence having a different bit length.

3. The transmission apparatus according to claim 1, further comprising:
a puncturing section performs puncturing on said plurality of coded bit sequences depending on a puncturing amount determined by a number of bits of the doping bit sequence inserted by said doping section.

4. A communication system comprising:
a transmission apparatus; and
a reception apparatus;
wherein the transmission apparatus comprises:
a sequence dividing section that divides a transmission bit sequence and generates a plurality of divided bit sequences;
a coding section that performs error-correcting coding independently on each of said plurality of divided bit sequences output by the sequence dividing section so as to generate a plurality of coded bit sequences;
a multilayer modulation section that forms a symbol by bits selected from said plurality of coded bit sequences; and
a doping section that inserts a doping bit sequence, which is already known by a reception apparatus, into at least one of said plurality of divided bit sequences so as to input the generated bit sequence into said coding section corresponding to the distance between signal points of each layer in multilayer modulation; and
wherein the reception apparatus comprises:
a multilayer demodulation section that outputs a plurality of received bit sequences acquired by performing demodulation processing on a received modulation symbol sequence;

a decoding section that independently performs error-correcting decoding on each of said plurality of received bit sequences so as to generate a plurality of information bit sequences; and
a sequence combining section that combines said plurality of information bit sequences to output an information bit sequence, wherein said decoding section performs the error-correcting decoding based on a doping bit sequence inserted by the transmission apparatus and information representing an inserting position thereof.

* * * * *